United States Patent [19]
Dittmann et al.

[11] Patent Number: 5,446,626
[45] Date of Patent: Aug. 29, 1995

[54] PLUGGABLE ASSEMBLY, PARTICULARLY A RELAY MODULE FOR MOTOR VEHICLES

[75] Inventors: Michael Dittmann, Berlin; Erwin Kruger, Colonge, both of Germany

[73] Assignee: Siemens Aktiengesellschaft, Munich, Germany

[21] Appl. No.: 274,328

[22] Filed: Jul. 13, 1994

[30] Foreign Application Priority Data

Jul. 15, 1993 [DE] Germany .................. 43 23 827.0

[51] Int. Cl.⁶ .................. H01R 23/68; H05K 5/02
[52] U.S. Cl. .................. 361/785; 174/260; 439/43; 361/813
[58] Field of Search .......... 361/785, 786, 791, 813, 361/736, 748, 760–764; 174/52.2, 260–261; 439/43, 49–50

[56] References Cited

U.S. PATENT DOCUMENTS

| | | |
|---|---|---|
| 4,400,761 | 8/1983 | Hayden et al. . |
| 4,466,678 | 8/1984 | Fuchs . |
| 4,772,761 | 9/1988 | Ibrahim et al. . |
| 4,879,630 | 11/1989 | Boucard et al. .......... 361/704 |
| 5,040,097 | 8/1991 | Stribel . |
| 5,243,217 | 9/1993 | Yamada .............. 257/692 |
| 5,309,460 | 5/1994 | Fujimaki et al. .......... 257/787 |

FOREIGN PATENT DOCUMENTS

| | | |
|---|---|---|
| 0312415 | 4/1989 | European Pat. Off. . |
| 0358504 | 3/1990 | European Pat. Off. . |
| 0489654 | 6/1992 | European Pat. Off. . |
| 1911779 | 9/1970 | Germany . |
| 2735124 | 2/1978 | Germany . |
| 2939266 | 4/1981 | Germany . |
| 3001234 | 7/1981 | Germany . |
| 3147674 | 6/1983 | Germany . |
| 3345701 | 6/1985 | Germany . |
| 3439410 | 4/1986 | Germany . |
| 3706964 | 9/1988 | Germany . |
| 8912914 | 2/1990 | Germany . |
| 3841893 | 6/1990 | Germany . |
| 1548517 | 7/1979 | United Kingdom . |
| 2180415 | 3/1987 | United Kingdom . |

*Primary Examiner*—Bot L. Ledynh
*Attorney, Agent, or Firm*—Hill, Steadman & Simpson

[57] ABSTRACT

A printed circuit board that is formed as a shaped part of plastic. Interconnects formed of punched leadframes are embedded into this printed circuit board in one or more planes. Moreover, flat plugs are integrally formed by the leadframes. Components, particularly relays, are preferably welded to bent-off tabs of the leadframes.

16 Claims, 4 Drawing Sheets

PLUGGABLE ASSEMBLY, PARTICULARLY A RELAY MODULE FOR MOTOR VEHICLES

BACKGROUND OF THE INVENTION

The invention is directed to a pluggable assembly having a printed circuit board, having components secured to the printed circuit board and electrically connected thereto via interconnects, and having flat plugs secured to the printed circuit board and each respectively connected to one of the interconnects. A preferred area of employment of the invention is assemblies for motor vehicles that contain relays and electronic component parts such as, for example, diodes and resistors and are connected via plug-type connections.

British Patent GB 2 180 415 A, for example, discloses a pluggable assembly of a general type. Electronic components are arranged therein on a traditional printed circuit board which is in turn secured in a housing. Flat plugs conducted through the housing wall are soldered to the printed circuit board. The situation is similar in a load circuit module disclosed by German Patent DE 38 41 893 A1. There, too, terminal elements are soldered to the printed circuit board, whereby flat plugs are not, however, involved.

In an electrical switchgear disclosed by German Patent DE 33 45 701 A1, preferably two printed circuit boards are arranged parallel and are connected at one end to a base-like terminal plate whose surface carries sheet metal strips formed of a punched leadframe for contacting the interconnects with wound terminal pins in the base. The sheet metal strips have their respective ends soldered to the interconnects of the printed circuit boards.

German Patent DE 29 39 266 A1 discloses a structural unit composed of a relay and of a circuit board, whereby the terminal pins of the relay are conducted through the circuit board and form the terminals of the structural unit together with separate terminal pins of the circuit board. What is true of the circuit board in this structural unit as well as of the afore-mentioned printed circuit boards is that the superficially laminated interconnects are not suitable for carrying high load currents of a type that flow, for instance, in motor vehicle relays.

German Patent DE 37 06 964 A1 further discloses an electrical assembly having a plurality of components, whereby an actual printed circuit board is not present but the interconnects formed by a punched lattice or leadframe themselves form the supporting part of the assembly. These punched parts then also form integrally applied plugs.

In a socket for a miniature relay disclosed by German Patent DE 31 47 674 C2, metallic bridges plugged in an insulating member are also partly provided with integrally applied flat plugs. The socket, however, is only suitable for the adaptation of a single relay, so that no mention can be made of an assembly or of a printed circuit board having interconnects for connecting a plurality of components.

SUMMARY OF THE INVENTION

An object of the invention is to create a pluggable assembly which has optimally few parts and has both high mechanical stability as well as a high electrical loadability, i.e., for example, is capable of conducting strong currents such as for motor vehicle relays in the load circuit.

The object is inventively achieved in that the printed circuit board is fashioned as a molded part of plastic; in that the interconnects are formed by at least one punched leadframe embedded into the printed circuit board; and in that the flat plugs emerge from an end section of the printed circuit board as integrally applied extensions of the leadframe or, respectively, of a plurality of leadframes.

As a result of the inventively provided employment of a punched leadframe for the interconnects, the cross section thereof can be dimensioned such by an appropriate selection of the sheet metal thickness that even higher load currents, for example load currents of relays, can be unproblematically carried. By embedding these interconnects in a molded part, particularly an injection molded part, the printed circuit board is not only lent the desired stability as carrier for the assembly but the interconnects are also largely insulated from one another and from the emplaced components. The flat plugs for the assembly are applied at the same time in the said pressed screen for the interconnects due to the thickness thereof. Not only is the plurality of parts thus reduced but soldered joints for the contacting of the terminal pins are also not required. This is not only advantageous because of the elimination of soldering steps; but also soldered joints are undesirable in assemblies having electrical switch contacts because the rosin thereby employed can contaminate the contact surfaces.

It is thus advantageous that, in a specific fashioning of the assembly of the invention, the components themselves are contacted to the interconnects for example, via spot welds rather than by soldering. With the relatively large cross sections of these punched interconnects, a welded contacting can be effectively implemented. Appropriate contact joints of the interconnects are expediently recessed in the embedding for the contacting of the components. It is also thereby expedient for larger components to bend contact tabs of the appertaining interconnects out of the plane of the leadframe and to recess a plug opening in the printed circuit board next to these contact tabs. Heavier components such as relays can thus be mechanically held by being plugged into these plug openings of the printed circuit board and can also be adequately electrically contacted for certain demands. Generally, however, the plug-type connections of the component will be subsequently welded to the contact tabs of the printed circuit.

It is also provided in an advantageous development to embed two or even more interconnect groups in the form of different punched leadframes in parallel planes into printed circuit board. It becomes possible in this way to provide punched leadframes of different thicknesses and, thus, to provide interconnects having different cross sections, so that, for example, the lower control currents can be conducted via thin interconnects and via terminal lugs having a small cross section, whereas high load currents are conducted via correspondingly thicker interconnects and via flat plugs having a large cross section. The different punched leadframes, of course, can also be connected directly in the region of the printed circuit board or can be connected via intervening components according to the electrical circuit design.

In an expedient development, further, the printed circuit board can extend not only in one plane but in two planes perpendicular relative to one another, so that a printed circuit board member having a L-shaped or T-shaped cross section arises. In this case, the leadframes for forming the interconnects are correspondingly angled off or crimped. Expediently, one leg, particularly a vertically residing longitudinal leg, thereby forms the actual printed circuit board for the acceptance and contacting of the components, whereas a second leg, particularly a horizontally proceeding cross-leg, serves as a base from whose underside the flat plugs emerge. Of course, additional components can also be secured and contacted in the base region. Given this shaping, it is also possible to fashion the cross-leg designed as a base such that it forms a closed housing together with a cover or cap inverted over the longitudinal leg.

The invention shall be set forth in greater detail with reference to exemplary embodiments below on the basis of the drawing.

DETAILED DESCRIPTION OF THE PREFERRED EMBODIMENTS

Figure 1:
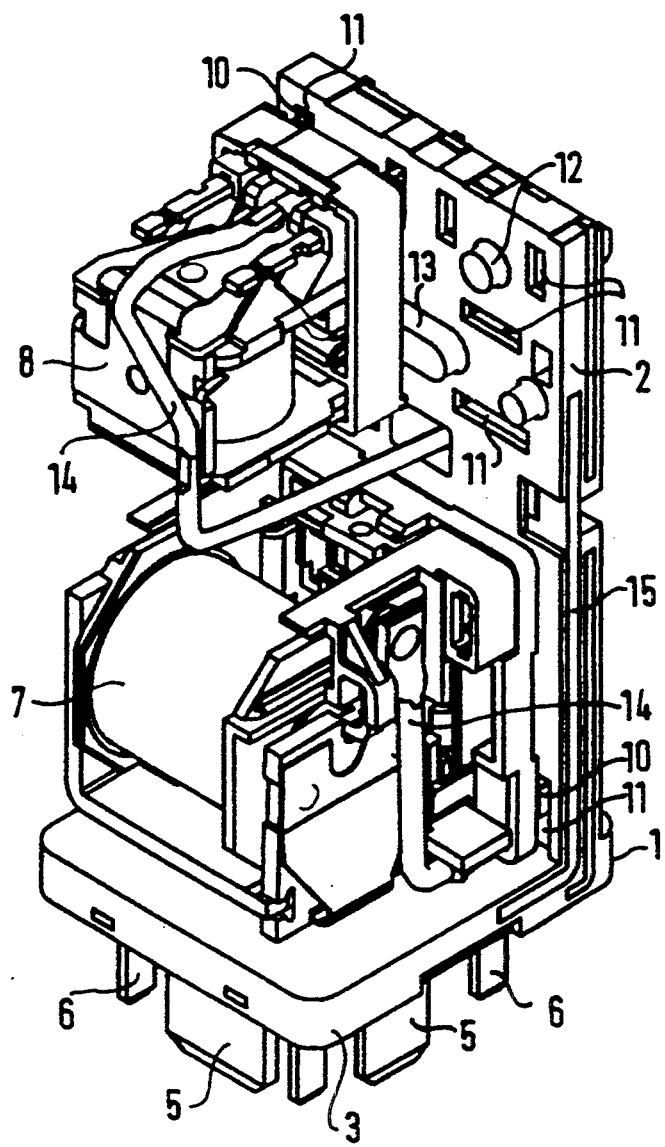
FIG. 1 is a perspective view of a pluggable assembly equipped with two relays, shown with a cover removed for clarity.
Figure 2:
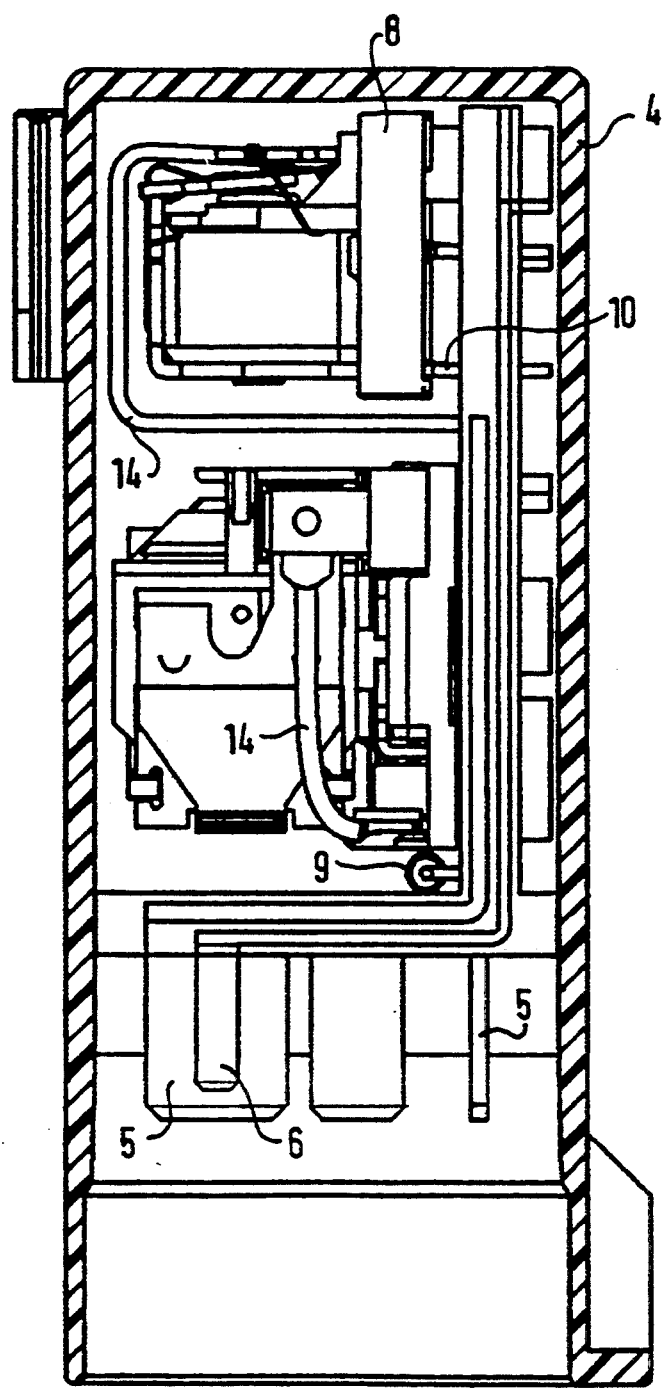
FIG. 2 is a side view of an assembly that is slightly modified in comparison to FIG. 1, with a side portion of the cover removed for clarity.

The assembly shown in FIG. 1 includes a printed circuit board 1 having a L-shaped cross section, whereby a vertical leg serves as actual printed circuit board leg 2 for the acceptance of components, whereas a horizontal leg serves as a base that forms a closed housing together with a cap or cover 4 (see FIG. 2). Plugs having different cross sections downwardly emerge from the base, i.e., broad flat plugs 5 having a large cross section and narrower flat plugs 6 having a smaller cross section. As may be seen in FIG. 2, the cover 4 extends beyond the base 3 over the plug region and surrounds the plugs 5 and 6 in the form of a protective collar.

In this example, the assembly contains two or, respectively, three relays 7 and 8 of different sizes and also contains smaller components 9 (see FIGS. 2 and 4); for example, these can be resistors or diodes. The relays 7 or, respectively, 8 have their flat plugs 10 plugged into plug openings 11 of the printed circuit board 1 and are welded to contact tabs of the interconnects at the back side, this to be set forth later. The relays 7 or, respectively, 8 are seated on spacer noses 12 or, respectively, ribs 13. FIG. 1 shows an assembly having only one relay 7 and a small relay 8, whereas space for a further relay of this size remains free to the right of the small relay 8. The plug openings 11 for this further relay may be seen at that location. In addition to ensuing via the flat plugs 10, for example, a contacting of components can also ensue via a wire such as a stranded conductor 14, as may likewise be seen in FIGS. 1 and 2.

The electrical connections between the terminal pins of the relays 7 and 8 as well as of the remaining components parts 9 to one another and to the flat plugs 5 and 6 ensues via interconnects 15 that are embedded in the printed circuit board 1, essentially in two parallel planes given the present example. The structure of this printed circuit board 1 with the interconnects 15 is illustrated with reference to FIGS. 3 and 4.

Figure 3:
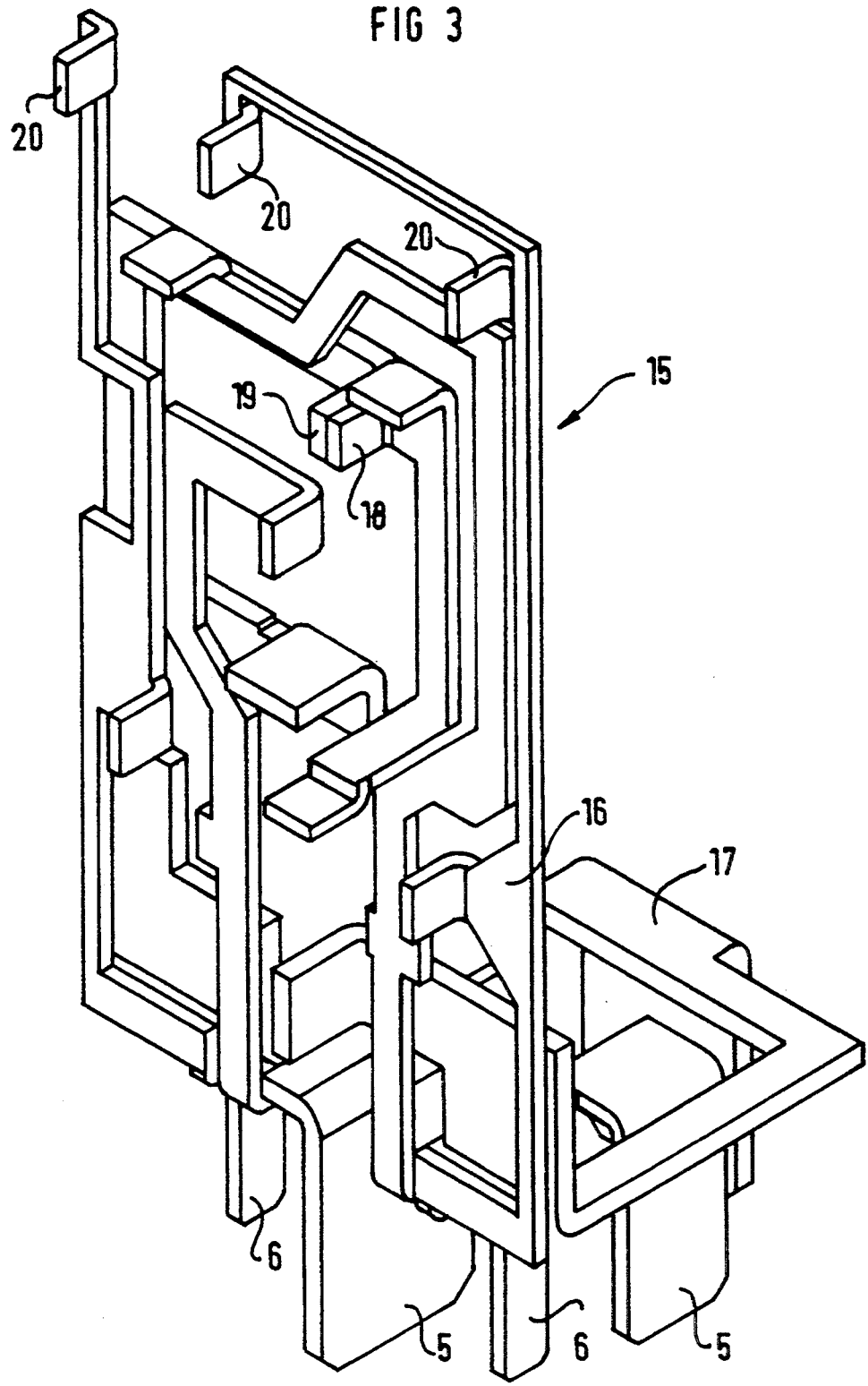
FIG. 3 is a perspective view of a punched leadframe arrangement for a printed circuit board similar to that employed in FIGS. 1 or 2.

FIG. 3 shows the structure of the interconnects. The interconnects are formed by two stamped plates or punched leadframes 16 and 17. These screens extend essentially in two planes parallel to one another, these planes residing perpendicularly relative to a plane of installation. In the lower region, these leadframes are extended by anglings and crimpings into the region of the base 3, forming the downwardly bent-off flat plugs 5 and 6 proceeding from this point.

As may be clearly seen, the leadframe 16 has less of a thickness than the leadframe 17 whereby the former essentially forms the interconnects and the plugs 6 for the lower control currents and the latter forms the interconnects and the plugs for the higher load currents. At those locations where electrical connections between the two interconnect groups are required, these are undertaken via connecting tabs 18 and 19 that are bent out of the respective interconnect plane and pressed flushly against one another, so that they can be easily welded. Further, bent-off contact tabs 20 serve the purpose of contacting components, particularly the plugged-in relays, these bent-off contact tabs 20 in the present example being all bent off to the back side of the printed circuit board as seen proceeding from the introduced components.

Figure 4:
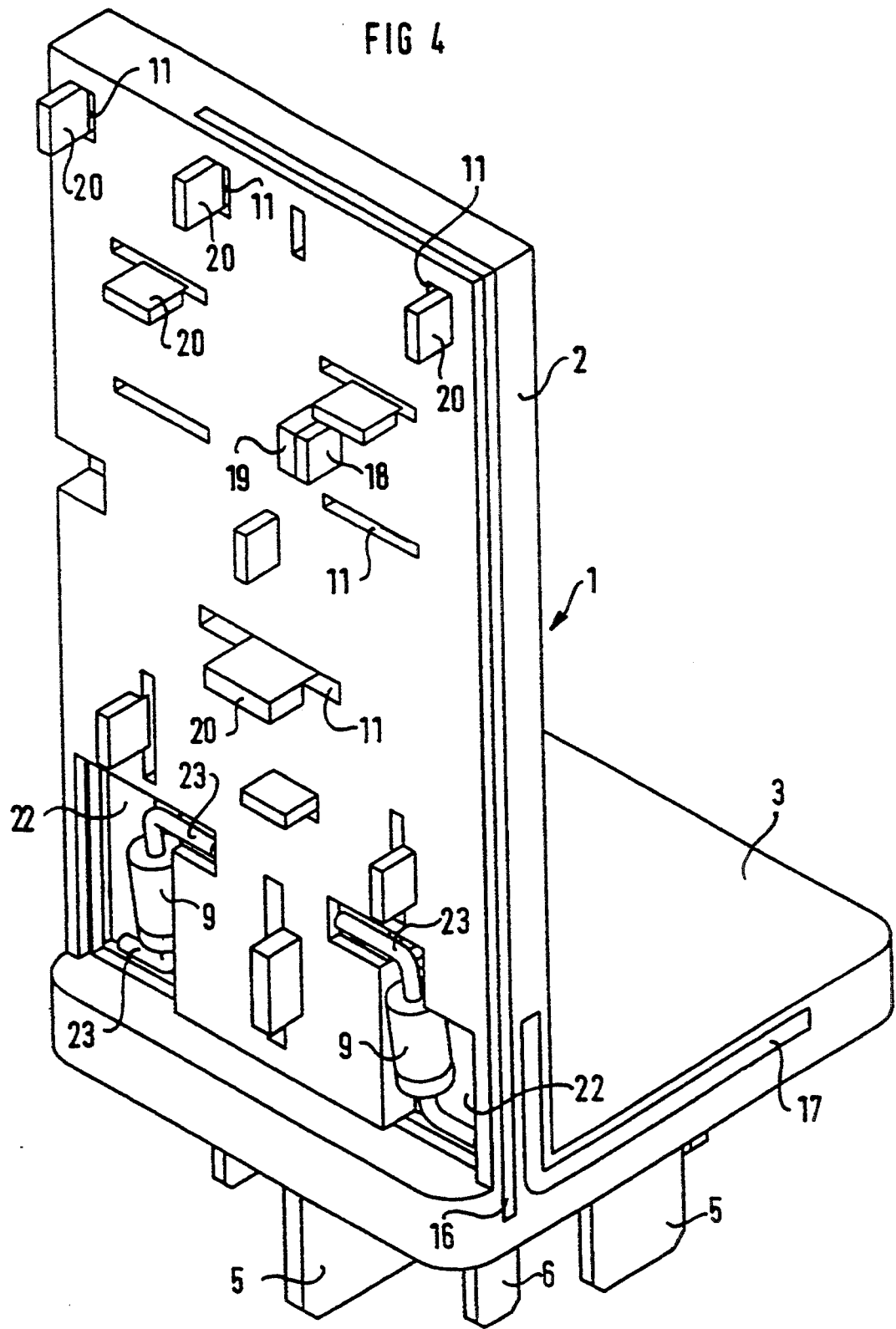
FIG. 4 is a perspective view of a printed circuit board acquired by injection molding of the leadframe arrangement of FIG. 3, partially equipped with components.

The two leadframes 16 and 17, aligned relative to one another in their parallel planes, are embedded in plastic according to FIG. 4, the printed circuit board arising as a result thereof. Plug openings 11 that at least partially adjoin a contact tab 20 are provided for the pluggable components such as relays. When plugging a relay or some other component according to FIG. 1 or 2, thus, the flat plugs 10 to be contacted in their plug opening 11 thus already press electrically conductively against the appertaining contact tab 20 at the back side of the printed circuit board 1 or, respectively, 2. For dependability, however, the contact tabs 20 are welded to the corresponding flat plugs 10 of the relays or, respectively, other components. This can occur in a simple way at the back side of the printed circuit board 1. Some of the plug openings 11, however, can also serve the purpose of a mere mechanical holding of a component part without a contacting having to occur thereat.

As shown in FIG. 4, larger recesses 22 can be provided in the printed circuit board 1 for further components 9. For example, diodes or resistors 9 have their lead wires 23 welded to recessed sections of the interconnects in these recesses 22; optionally, however, some other contacting would be possible, for example by soldering or crimping.

Of course, other configurations of the printed circuit board would also be conceivable, whereby more than two interconnect levels could also be provided or components could be anchored in the printed circuit board from both sides. It should thereby be mentioned that the leadframes that form the various interconnect levels can not only have different thicknesses but can also be fabricated of different materials.

Although the present invention has been described with reference to a specific embodiment, those of skill in the art will recognize that changes may be made thereto without departing from the scope and spirit of the invention as set forth in the appended claims.

We claim as our invention:

1. In a pluggable relay module having a printed circuit board, having components secured on the printed circuit board and electrically connected to one another via interconnects, and having flat plugs secured to the printed circuit board and each respectively connected to one of the interconnects, the improvement comprising:

the printed circuit board is fashioned as a molded part of plastic having a vertical first leg for the acceptance of components and a second leg that forms a base and the first and second legs being relatively perpendicular and molded of one piece;

the interconnects are formed by at least one punched leadframe embedded into the printed circuit board said at least one punched leadframe having interconnects within both said first leg and said second leg; and at least one flat plug emerges from an end section of the printed circuit board as an extension of the punched leadframe extending out of said second leg.

2. The improvement according to claim 1, wherein at least one leadframe forming the interconnects is enveloped on all sides by the plastic of the printed circuit board, whereby recesses are formed for fastening points for the components.

3. The improvement according to claim 1, wherein recesses for receiving smaller components are provided in the printed circuit board.

4. The improvement according to claim 1, wherein the printed circuit board comprises recesses for the plug-in fastening of larger components; and in that contact tabs of the leadframe are bent out of the plane of the leadframe adjacent said recesses.

5. The improvement according to one of the claim 1, wherein terminals of the components are welded to the interconnects.

6. The improvement according to claim 1 comprising a cover inverted over the printed circuit board forming a closed housing together with said base.

7. The improvement according to claim 1, wherein said at least one leadframe comprises a plurality of leadframes arranged in parallel planes and enveloped by a common printed circuit board member, each leadframe comprising an interconnect.

8. The improvement according to claim 7, wherein the leadframes are formed of different materials.

9. The improvement according to claim 7, wherein the leadframes have different material thicknesses.

10. In a pluggable assembly having a printed circuit board, having components secured on the printed circuit board and electrically connected to one another via interconnects, and having flat plugs secured to the printed circuit board and each respectively connected to one of the interconnects, the improvement comprising:

the printed circuit board is fashioned as a molded part of plastic;

the interconnects are formed by at least one punched leadframe embedded into the printed circuit board;

at least one flat plug emerges from an end section of the printed circuit board as an extension of the punched leadframe; and wherein said at least one leadframe comprises a plurality of leadframes arranged in parallel planes and enveloped by a common printed circuit board member, each leadframe comprising an interconnect.

11. The improvement according to claim 10, wherein the leadframes are formed of different materials.

12. The improvement according to claim 10, wherein the leadframes have different material thicknesses.

13. In a pluggable assembly having a printed circuit board, having components secured on the printed circuit board and electrically connected to one another via interconnects, and having flat plugs secured to the printed circuit board and each respectively connected to one of the interconnects, the improvement comprising:

the printed circuit board is fashioned as a molded part of plastic;

the interconnects are formed by at least one punched leadframe embedded into the printed circuit board;

at least one flat plug emerges from an end section of the printed circuit board as an extension of the punched leadframe; and wherein the printed circuit board has at least two printed circuit board planes residing perpendicularly relative to one another; and said at least one leadframe forms interconnects in two planes that are perpendicular relative to one another.

14. In a pluggable assembly having a printed circuit board, having components secured on the printed circuit board and electrically connected to one another via interconnects, and having flat plugs secured to the printed circuit board and each respectively connected to one of the interconnects, the improvement comprising:

the printed circuit board is fashioned L-shaped as a molded plastic part and having a first leg and a second leg forming a base;

the interconnects are formed by a plurality of parallel punched leadframes embedded into the printed circuit board each leadframe comprising an interconnect;

at least one flat plug emerges from the base of the printed circuit board as an extension of the punched leadframe; and wherein the leadframes have different material thicknesses.

15. The improvement according to claim 14, wherein at least one leadframe forming the interconnects is enveloped on all sides by the plastic of the printed circuit board, whereby recesses are formed for fastening points for the components.

16. In a pluggable assembly having a printed circuit board, having components secured on the printed circuit board and electrically connected to one another via interconnects, and having flat plugs secured to the printed circuit board and each respectively connected to one of the interconnects, the improvement comprising:

the printed circuit board is fashioned L-shaped as a molded plastic part and having a first leg and a second leg forming a base;

the interconnects are formed by a plurality of punched leadframes embedded into the printed circuit board each leadframe comprising an interconnect;

at least one flat plug emerges from the base of the printed circuit board as an extension of the punched leadframe; and at least one leadframe of said plurality of leadframe forms interconnects in two planes that are perpendicular relative to one another; and a cover inverted over the printed circuit board forming a closed housing together with said base.

* * * * *